United States Patent
Bae et al.

(10) Patent No.: US 8,801,997 B2
(45) Date of Patent: Aug. 12, 2014

(54) FABRICATION METHOD OF FLEXIBLE DEVICES

(75) Inventors: Byeong-Soo Bae, Daejeon (KR); JungHo Jin, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 183 days.

(21) Appl. No.: 13/106,124

(22) Filed: Jun. 14, 2011

(65) Prior Publication Data

US 2012/0061881 A1 Mar. 15, 2012

(30) Foreign Application Priority Data

Sep. 13, 2010 (KR) .................. 10-2010-0089323

(51) Int. Cl.
*B29C 59/16* (2006.01)
*B29C 33/42* (2006.01)

(52) U.S. Cl.
USPC ........................................ 264/447; 264/219

(58) Field of Classification Search
USPC ................................................ 264/447, 219
See application file for complete search history.

(56) References Cited

U.S. PATENT DOCUMENTS

| 2007/0134849 A1 | 6/2007 | Vanfleteren et al. |
| 2007/0145602 A1 | 6/2007 | Yang |
| 2010/0075124 A1 | 3/2010 | Kim et al. |

FOREIGN PATENT DOCUMENTS

| KR | 20060028537 | 3/2006 |
| KR | 10-2007-0047114 A | 5/2007 |
| KR | 10-2010-0083697 A | 7/2010 |
| WO | 2005050754 A1 | 6/2005 |
| WO | 2007147926 A1 | 12/2007 |

*Primary Examiner* — Larry Thrower
*Assistant Examiner* — Xue Liu
(74) *Attorney, Agent, or Firm* — The Webb Law Firm

(57) ABSTRACT

Disclosed is a method of fabricating a flexible device, which includes surface-treating one or both sides of a carrier plate so that regions with different surface-treatments are formed on the same side of the carrier plate, forming a glass-filler reinforced plastic substrate film on the surface-treated carrier plate, forming thin film patterns on the glass-filler reinforced plastic substrate film, and separating the glass-filler reinforced plastic substrate film having the thin film patterns formed thereon from the carrier plate, and in which the surface-treating of the carrier plate enables the glass-filler reinforced plastic substrate film to be easily separated from the carrier plate without an additional process such as using a solvent or a laser release technique.

9 Claims, 1 Drawing Sheet

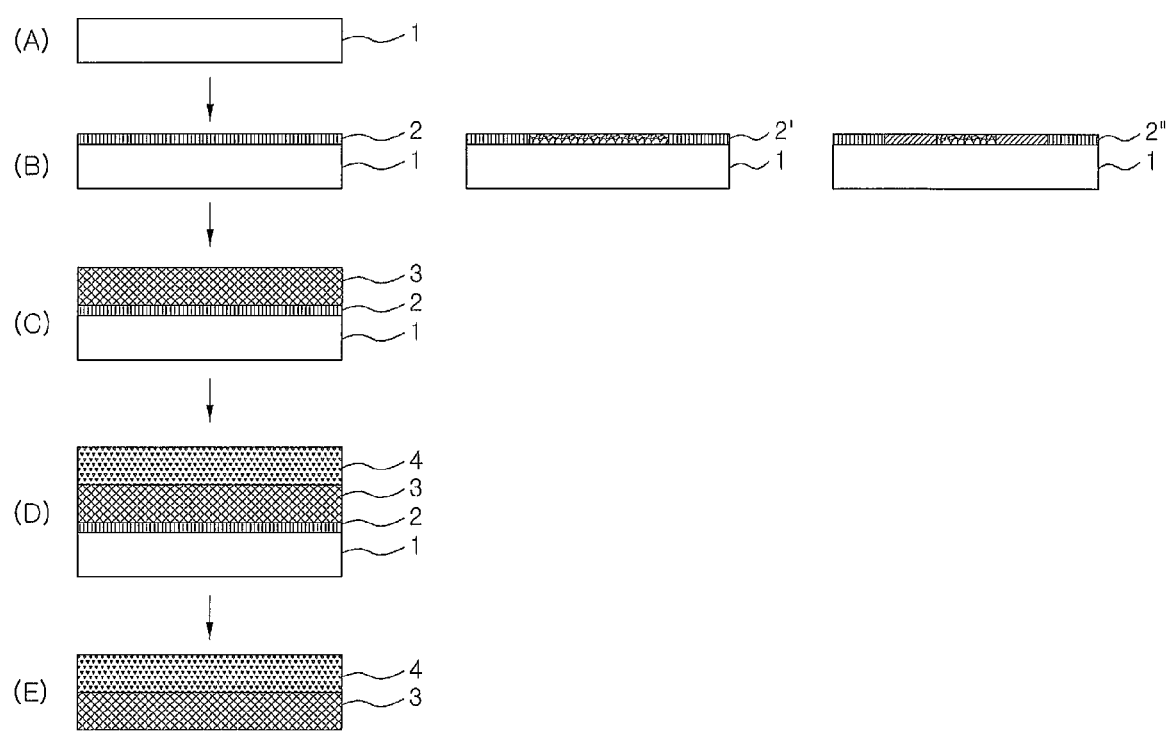

FABRICATION METHOD OF FLEXIBLE DEVICES

BACKGROUND OF THE INVENTION

1. Technical Field

The present invention relates to a method of fabricating a flexible device, and more particularly to a method of fabricating a flexible device, which enables an electronic, photoelectronic or energy device including a display to be reliably manufactured on a plastic substrate and also which enables a plastic substrate formed on a carrier plate to be easily separated from the carrier plate without an additional separation process thus facilitating the fabrication of the device.

2. Description of the Related Art

Recently, thorough research into flexible devices to develop electronic, photoelectronic, and energy devices including conventional flat panel displays, having environment-friendly properties, low power consumption, small sizes, lightweight, and flexibility, is ongoing. In order to enable flexible devices, a flexible substrate should be used as the most fundamental starting component. Typically useful candidates as the flexible substrate are metal foil, ultra-thin glass, plastic or a polymer film. In particular, the development of flexible devices using plastic or polymer films which may be easily applied to roll-to-roll processing and ink-jet printing and which have high price competitiveness is under very active study these days. Despite this being such an era and there being a technical demand, however, research into reliable flexible device fabrication processes for commercialization and mass production is still insufficient.

Methods of fabricating an electronic, photoelectronic or energy device including a display on a plastic film substrate are reported to be methods of fabricating devices directly onto freestanding plastic substrates, fabricating devices on plastic substrates using adhesives, a transfer process, and a laser release process. The case of fabricating devices directly onto freestanding plastic substrates is disadvantageous because the device is directly manufactured on a plastic substrate without a carrier plate, making it difficult to handle the fabricating process due to the absence of the carrier plate and to reliably manufacture the device due to severe deformation of the plastic substrate. For this reason, the fabrication of a flexible device backplane using a carrier plate such as a glass plate or the like is recently regarded as typical, which includes attaching a plastic or polymer film substrate to such a carrier plate, forming a device on the film substrate and then removing the carrier plate. For example, the use of such a carrier plate is disclosed in Korean Unexamined Patent Publication No. 10-2006-0028537, which includes attaching a plastic substrate to a carrier plate using an adhesive, fabricating a device, and then removing the carrier plate. The case of fabricating devices on plastic substrates using adhesives makes it possible to comparatively fabricate a flexible device in such a reliable manner that the device is formed on the plastic substrate attached onto the carrier plate using an adhesive or adhesion tape and then the carrier plate is removed using an organic solvent or the like. In this case, however, the adhesive may be left behind, undesirably causing contamination, and also the additional separation process is inevitably performed attributed to the use of the organic solvent. Furthermore, in the case of the transfer process and the laser release process, a release method including adhering a plastic substrate to a carrier plate using an amorphous silicon based sacrificial layer, fabricating a device and then removing the carrier plate using a laser and a device transfer method including a similar process are respectively disclosed in PCT WO 2005/050754 A1 and IEEE TRANSACTION ON ELECTRON DEVICES, VOL. 49, NO. 8 (2002). However, these methods are problematic because the amorphous silicon sacrificial layer functioning to attach the plastic substrate should be provided, undesirably complicating the fabrication process. In particular, because a laser is used during the transfer and separation processes, the yield is undesirably reduced and the process cost is increased.

SUMMARY OF THE INVENTION

Accordingly, the present invention has been made keeping in mind the problems encountered in the related art and the present invention is intended to provide a method of fabricating a flexible device, which includes forming a plastic substrate equipped with chemical and heat resistance adapted for the processing conditions used when fabricating a device on a carrier plate, forming a device on the plastic substrate, and then easily separating the plastic substrate from the carrier plate.

Also the present invention is intended to provide a method of fabricating a flexible device in which a plastic substrate having a low coefficient of thermal expansion is used for reliable fabrication of flexible devices without using either an adhesive or a laser release technique when the plastic substrate is formed on or separated from the carrier plate.

An aspect of the present invention provides a method of fabricating a flexible device, which is different from the aforementioned conventional techniques, the method including surface-treating one or both sides of a carrier plate so that regions with different surface-treatments are formed on the same side of the carrier plate; forming a glass-filler reinforced plastic substrate film on the surface-treated carrier plate; forming thin film patterns on the glass-filler reinforced plastic substrate film; and separating the glass-filler reinforced plastic substrate film having the thin film pattern formed thereon from the carrier plate.

BRIEF DESCRIPTION OF THE DRAWING

FIG. 1 shows a process of fabricating a flexible device according to an embodiment of the present invention.

DESCRIPTION OF THE REFERENCE NUMERALS IN THE DRAWINGS

1: carrier plate
2, 2', 2": surface treatment region
3: glass-filler reinforced plastic substrate film
4: thin film pattern

DESCRIPTION OF SPECIFIC EMBODIMENTS

Hereinafter, a method of fabricating a flexible device according to the present invention will be described in detail while referring to the accompanying drawings. As shown in FIG. 1, the method of fabricating a flexible device according to the present invention includes (A) cutting a carrier plate 1 to a predetermined size, (B) surface-treating one or both sides of the carrier plate 1 so that different surface treatment regions 2, 2', 2" are formed on the same surface, (C) forming a glass-filler reinforced plastic substrate film 3 on the surface-treated carrier plate, (D) forming a thin film pattern 4 on the glass-filler reinforced plastic substrate film 3, and (E) separating the glass-filler reinforced plastic substrate film 3 having the thin film pattern 4 from the carrier plate 1.

The carrier plate may be made of glass, but the present invention is not necessarily limited thereto.

In (B), the different surface treatment regions include a region formed by plasma or ion beam treatment, or a region formed by depositing or coating an organosilane or organosilazane or a siloxane based resin composition, and are represented by 2, 2' or 2" in FIG. 1.

As such, the surface-treating process, which is performed to form a predetermined pattern or differently surface-treat a portion of the surface so that different surface treatment regions are formed on the carrier plate, plays a role in the easy separation of the plastic substrate formed on the carrier plate. From this point of view, the surface treatment region 2', 2" is more preferable.

Furthermore, surface-treating the carrier plate includes surface modification of a carrier plate using plasma or ion beam treatment or surface modification of a carrier plate using a thin film coating of an organosilane or organosilazane or a siloxane based resin or an organic resin. Specifically, the surface of the carrier plate is subjected to plasma treatment, deposition using an organosilane or organosilazane, or coating with an organic resin or a siloxane resin to form a thin film, whereby an organic resin coating having an organic functional group that is different from that of the resin used to form the glass-filler reinforced plastic substrate film may be formed. This coating functions to prevent strong direct physical or chemical bonding between the carrier plate and the glass filler reinforced plastic substrate film, which is thus considered to be different from conventional techniques that involve an adhesive.

The surface-treating process may be performed so that a predetermined pattern is formed on all or part of the surface of the carrier plate. For example, a surface-treating process may be selectively conducted on four sides of the carrier plate having a predetermined width. In this case, a combination of one or more selected from among the above-mentioned surface-treating processes may be applied.

Specifically, the organosilane or organosilazane used for surface-treating may include 3-aminopropyltrimethoxysilane, 3-methacryloxypropyltrimethoxysilane, epoxycyclohexyltrimethoxysilane, vinyltrimethoxysilane, 1H,1H,2H,2H-heptadecafluorodecyltrimethoxysilane, hexamethyldisilazane, etc.

Also, the organic resin used for surface-treating may include a resin including 3,4-dihydroxyphenyl-L-alanine, methacryl, acryl, epoxy, vinyl, amine, etc.

In (C), the glass-filler reinforced plastic substrate film is provided in the form of a transparent composite in which a glass filler is impregnated or incorporated or dispersed in a transparent siloxane based resin or an organic resin having a crosslinkable group, and may be formed on the carrier plate by being crosslinked by means of a thermal-catalyst or a photo-catalyst. Then, the surface of the substrate film being formed may be flattened by applying pressure thereto. When the glass-filler reinforced plastic substrate film is used in this way, the coefficient of thermal expansion may be lowered, flexibility may be increased, and also mechanical and thermal stability may be enhanced.

The glass filler may be selected from among glass cloth or glass fabric, nonwoven glass fabric, mesh, glass beads, glass powder, glass flakes, chopped glass, milled glass, fumed silica sol, colloidal silica, and combinations thereof.

When the glass fabric is used, the thickness of the glass-filler reinforced plastic substrate film may be determined depending on the thickness of the glass fabric used, the number of sheets of glass fabric, the amount of incorporated resin, and the pressure applied to achieve surface flatness.

Also a hard coating layer may be formed on the glass-filler reinforced plastic substrate film in order to achieve flatness and gas barrier property, and to prevent physical and/or chemical damage.

The hard coating layer may include at least one of a crosslinkable organic resin, a crosslinkable organic resin having inorganic nanoparticles dispersed therein, and an inorganic film. The coating layer may be selected from among methacryl, acryl, and epoxy resins, and the inorganic film may include $SiO_2$ or $Al_2O_3$, but the present invention is not necessarily limited thereto.

In (D), the thin film pattern may be provided to fabricate, for example, a thin film transistor, a liquid crystal display, an electrophoretic display, an organic light emitting diode, a plasma display, a touch screen panel, a solar cell, and a small optical device.

In (E), the glass-filler reinforced plastic substrate film having the thin film pattern formed thereon may be easily separated from the carrier plate, without an additional separation process such as using a laser or a solvent including wet etching.

A better understanding of the present invention may be obtained via the following examples which are set forth to illustrate, but are not to be construed as limiting the present invention.

Example 1

A glass plate was cut to a size of 10 cm×10 cm, and then subjected to oxygen plasma treatment. Subsequently, the center region of the glass plate except the four sides thereof having a width of 1 cm was deposited with 1H,1H,2H,2H-heptadecafluorodecyltrimethoxysilane. On the glass plate thus surface-treated, a 50 μM-thick glass fabric (E-glass, Nittobo, Japan) was disposed, and a siloxane resin (MD or HMD Hybrimer, KAIST, Korea) having methacryl groups and phenyl groups was coated thereon and thus impregnated therein. While pressure was applied thereto, 365 nm UV was irradiated for 5 min in a nitrogen atmosphere, thus forming a glass-fiber reinforced plastic substrate film on the carrier plate. On the glass-fiber reinforced plastic substrate film formed on the surface-treated glass plate, atomic layer deposition (ALD) and radio frequency (RF) sputtering were performed at 150° C., thus fabricating an oxide semiconductor thin film transistor. Thereafter, the glass-fiber reinforced plastic substrate film was separated from the glass plate without an additional process.

Example 2

A glass plate was cut to a size of 10 cm×10 cm, and then subjected to oxygen plasma treatment. Subsequently, the glass plate was surface-treated in such a manner that the center region of the glass plate except the four sides thereof having a width of 1 cm was coated with a siloxane resin (ED Hybrimer, KAIST, Korea) having epoxy groups and phenyl groups to form a thin film. Subsequently, two 25 μm-thick sheets of glass fabric (E-glass, Nittobo, Japan) were disposed on the surface-treated glass plate, and a siloxane resin (MD or HMD Hybrimer, KAIST, Korea) having methacryl groups and phenyl groups was coated thereon and thus impregnated therein. While pressure was applied thereto, 365 nm UV was irradiated for 5 min in a nitrogen atmosphere, thus forming a glass-fiber reinforced plastic substrate film on the carrier plate. ALD and RF sputtering were performed at 150° C. on the glass-fiber reinforced plastic substrate film formed on the surface-treated glass plate, thus fabricating an oxide semiconductor thin film transistor. Thereafter, the glass-fiber reinforced plastic substrate film was separated from the glass plate without an additional process.

Example 3

A glass plate was cut to a size of 10 cm×10 cm, and then subjected to oxygen plasma treatment. Subsequently, the glass plate was surface-treated in such a manner that four sides of the glass plate having a width of 1 cm were coated with a polydophamine aqueous solution resin to form a thin film and the center region thereof was deposited with 1H,1H, 2H,2H-heptadecafluorodecyltrimethoxysilane. On the glass plate thus surface-treated, two 25 μm-thick sheets of glass fabric (E-glass, Nittobo, Japan) were disposed, and a siloxane resin (ED Hybrimer, KAIST, Korea) having epoxy groups and phenyl groups was coated thereon and thus impregnated therein. 365 nm UV was then irradiated for 5 min, thus forming a glass-fiber reinforced plastic substrate film on the carrier plate. ALD and RF sputtering were performed at 150° C. on the glass-fiber reinforced plastic substrate film formed on the surface-treated glass plate, thus fabricating an oxide semiconductor thin film transistor. Thereafter, the glass-fiber reinforced plastic substrate film was separated from the glass plate without an additional process.

Example 4

A glass plate was cut to a size of 10 cm×10 Cm, and then subjected to oxygen plasma treatment. Subsequently, the glass plate was surface-treated in such a manner that the center region of the glass plate except the four sides thereof having a width of 1 Cm was coated with a siloxane resin having epoxy groups and phenyl groups to form a thin film. On the glass plate thus surface-treated, two 25 μm-thick sheets of glass fabric (E-glass, Nittobo, Japan) were disposed, and a siloxane resin (MD or HMD Hybrimer, KAIST, Korea) having methacryl groups and phenyl groups was coated thereon and thus impregnated therein. 365 nm UV was then irradiated for 5 min, thus forming a glass-fiber reinforced plastic substrate film on the carrier plate. Subsequently, photo-assisted chemical vapor deposition (photo-CVD) and RF-plasma enhanced chemical vapor deposition (RF-PECVD) were performed at 250° C. on the glass-fiber reinforced plastic substrate film formed on the surface-treated glass plate, thus fabricating an amorphous silicon (a-Si) thin film solar cell. Thereafter, the glass-fiber reinforced plastic substrate film was separated from the glass plate without an additional process.

The flexible devices of Examples 1 to 4 showed that the glass-fiber reinforced plastic substrate film formed on the carrier plate was easily separated.

As described hereinbefore, the present invention provides a method of fabricating a flexible device. According to the present invention, a carrier plate is surface-treated so that a glass-filler reinforced plastic substrate film having the fabricated device can be easily separated from the carrier plate, thereby making it easier to fabricate the flexible device.

Although the embodiments of the present invention have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A method of fabricating a flexible device, comprising:
   surface-treating one or both sides of a carrier plate in a regionally selective manner so that regions with different surface-treatments are formed on the same side of the carrier plate;
   forming a glass-filler reinforced plastic substrate film on the carrier plate which was surface-treated as aforesaid, the glass-filler reinforced plastic substrate film being provided in a form of a transparent composite in which a glass-filler is impregnated with a transparent siloxane based resin having a crosslinkable reactive group;
   forming thin film patterns on the aforesaid glass-filler reinforced plastic substrate film; and
   separating the glass-filler reinforced plastic substrate film having the thin film patterns formed thereon from the carrier plate.

2. The method of claim 1, wherein the carrier plate comprises glass.

3. The method of claim 1, wherein the differently surface-treated regions comprise a region formed by plasma or ion beam treatment, or a region formed by depositing or coating an organosilane or organosilazane or a siloxane based resin composition.

4. The method of claim 1, wherein the surface-treating comprises surface modification of a carrier plate using plasma or ion beam treatment, or surface modification of a carrier plate using a thin film coating of an organosilane or organosilazane or a siloxane based resin or an organic resin.

5. The method of claim 1, wherein the glass-filler is selected from the group consisting of glass cloth or glass fabric, nonwoven glass fabric, glass mesh, glass beads, glass powder, glass flakes, chopped glass, milled glass, fumed silica sol, colloidal silica, and combinations thereof.

6. The method of claim 1, wherein the forming the glass-filler reinforced plastic substrate film is performed by impregnating the glass-filler with a crosslinkable siloxane based resin and then applying pressure thereto so as to achieve surface flatness.

7. The method of claim 1, wherein the glass-filler reinforced plastic substrate film is coated with a coating layer so as to achieve flatness and/or gas barrier property.

8. The method of claim 7, wherein the coating layer comprises at least one of a crosslinkable organic resin, a crosslinkable organic resin having inorganic nanoparticles dispersed therein or an inorganic film and combinations thereof.

9. The method of claim 1, wherein the thin film pattern comprises a thin film transistor, a liquid crystal display, an electrophoretic display, an organic light emitting diode, a plasma display, a touch screen panel, a solar cell, or an optical device.

* * * * *